United States Patent [19]

Deie

[11] Patent Number: 5,285,106
[45] Date of Patent: Feb. 8, 1994

[54] SEMICONDUCTOR DEVICE PARTS

[75] Inventor: Toshikazu Deie, Aioi, Japan

[73] Assignee: Kabushiki Kaisha Toshiba, Kawasaki, Japan

[21] Appl. No.: 873,984

[22] Filed: Apr. 27, 1992

Related U.S. Application Data

[63] Continuation of Ser. No. 642,435, Jan. 17, 1991, abandoned.

[30] Foreign Application Priority Data

Jan. 18, 1990 [JP] Japan ..................................... 2-9162

[51] Int. Cl.⁵ ...................... G06K 19/00; H01L 23/12
[52] U.S. Cl. .................................. 257/678; 174/52.4; 257/693; 257/698; 439/741
[58] Field of Search ....................... 357/81, 79, 80, 68, 357/74, 72; 257/693, 698; 339/220 R; 174/52 FP

[56] References Cited

U.S. PATENT DOCUMENTS

| | | | |
|---|---|---|---|
| 2,999,963 | 9/1961 | Schneider | 357/74 |
| 3,519,889 | 7/1970 | Monaco | 357/74 |
| 3,585,272 | 6/1971 | Shatz | 357/81 |
| 3,637,994 | 1/1972 | Ellinghoe | 357/74 |
| 3,662,086 | 5/1972 | Hessinger | 357/81 |
| 3,837,001 | 9/1974 | Hughes et al. | 357/68 |
| 4,115,838 | 9/1978 | Yagusic et al. | 357/81 |
| 4,199,654 | 4/1980 | DeRoss | 357/81 |
| 4,379,611 | 4/1983 | Foege et al. | 339/217 |
| 4,833,522 | 5/1989 | Egerbacher et al. | 357/74 |

FOREIGN PATENT DOCUMENTS

| | | |
|---|---|---|
| 0140473A1 | 5/1985 | European Pat. Off. . |
| 0317310A3 | 5/1989 | European Pat. Off. . |
| 60-157243 | 8/1985 | Japan . |
| 62-158349 | 7/1987 | Japan . |

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

External electrode terminal parts and a plastic terminal supporting body are individually formed, and the terminal parts are inserted into through holes of the terminal supporting body, thereby completing a terminal holder. Each of the terminal parts has a stopper portion at a predetermined position in its longitudinal direction, such that the stopper portion is wider than the width of the hole in the terminal supporting body. Hence, the distance between the terminal supporting body and the end of the terminal parts is defined when the terminal parts are inserted into holes of the terminal supporting body. In addition, since the terminal parts include a spring portion which abuts against the inner wall of the hole in the terminal supporting body when inserted therein, the terminal parts cannot slip out of the terminal supporting body. Since the terminal holder is formed by only inserting the terminal parts into the holes of the plastic terminal supporting body, the terminal parts cannot be deformed, and the terminal holder can be manufactured easily even if the number of terminal parts is large or the configuration thereof is complicated.

4 Claims, 4 Drawing Sheets

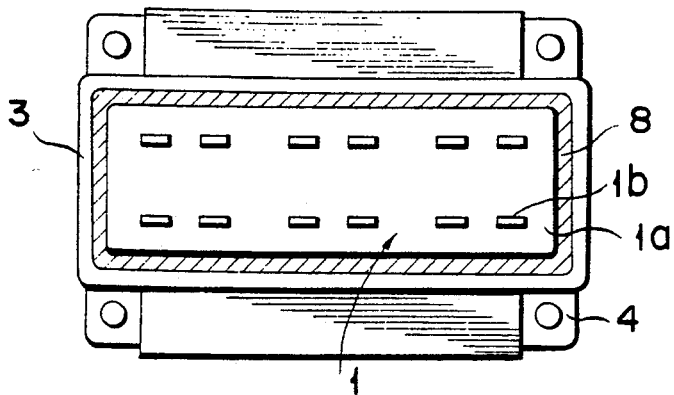
F I G. 1A
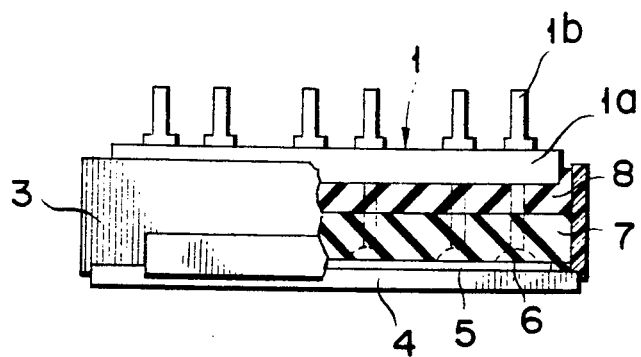
F I G. 1B
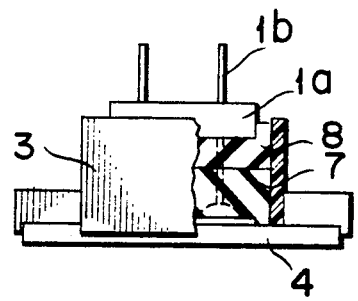
F I G. 1C

SEMICONDUCTOR DEVICE PARTS

This application is a continuation of application Ser. No. 07/642,435 filed Jan. 17, 1991, abandoned.

BACKGROUND OF THE INVENTION

1. Field of the Invention

This invention relates to semiconductor device parts for use in a plastic packaged high-power semiconductor device and the like, and, more particularly, to semiconductor device parts comprising external electrode terminals and a terminal supporting body which is a portion of a package of the semiconductor device.

2. Description of the Related Art

FIG. 1A is a plan view showing the outer appearance of a plastic packaged high-power semiconductor device (G-TR Module) in general, and FIGS. 1B and 1C are partial cross-sectional front and side views, respectively, of the semiconductor device shown in FIG. 1A. In the device shown in FIGS. 1A to 1C, a semiconductor chip (not shown) is mounted on a circuit board 5 and electrically connected thereto by bonding wires. An electrode bed (not shown) for connecting electrodes to the external device is formed on the circuit board 5. A plastic terminal supporting body 1a and external electrode terminal parts 1b are formed integral with each other, constituting a terminal holder 1. The semiconductor device is formed as follows.

First, external electrode terminal parts 1b are placed in a plastic molding die, and plastic is injected into the die to form a terminal holder 1. Inner lead ends of the external electrode terminal parts 1b are adhered by solder 6 to the electrode bed on the circuit board 5. Next, a case 3, a heat radiating board 4, and the like are attached to the circuit board 5. To protect electronic circuits on the circuit board 5 from moisture, vibration, and the like, potting material 7 is injected into the case 3. Further, casting material 8 is injected on the potting material 7. In this way, a semiconductor device is completed as a product.

FIG. 2 is a perspective view showing the outer appearance of conventional semiconductor device parts (terminal holder 1). FIGS. 3A and 3B are partial cross-sectional front and side views, respectively, of the semiconductor device parts shown in FIG. 2. The external electrode terminal parts 1b for connecting an internal electrode on the circuit board 5 to an external device and the plastic terminal supporting body 1a are formed integral with each other by mean of plastic molding by use of a molding die. During the plastic molding, it is necessary to prevent plastic from being forced out through gaps between the molding die and the terminal parts 1b. For this purpose, the terminal parts 1b are fastened tightly by the molding die.

When the number of the external electrode terminal parts 1b are increased or when configurations of the terminal parts 1b are complicated, a complicated molding die must be used. As a result, it may be impossible to form the terminal parts 1b integral with the terminal supporting body 1a. In addition, due to the contacts between the terminal parts 1b and the molding die which occur when the terminal parts 1b are fastened by the molding die or due to the plastic injection pressure which is applied to the external electrode terminal parts 1b when the terminal parts 1b are molded, the external electrode terminal parts 1b tend to be deformed. When deformed defective terminal parts 1b are adhered to the circuit board 5 by a solder 6, the inner lead end 1b-1 of such defective terminal parts 1b cannot be perfectly adhered to the electrode bed. Thus, the defective terminal parts 1b-1 cannot be practically used. Since such defective terminal parts 1b lower the molding yield, the cost of manufacturing the terminal holder is inevitably increased.

SUMMARY OF THE INVENTION

It is an object of the present invention to provide semiconductor device parts of high quality which can be manufactured at a low cost, with substantially no defective external electrode terminal parts produced, even in a case that the semiconductor device parts have a great number of external electrode terminal parts or external electrode terminal parts of a complicated configuration.

The semiconductor device according to the present invention comprises plastic terminal supporting means having through holes, which serves as a portion of a package of a plastic packaged semiconductor device, and external electrode terminal means which are inserted in the through holes for connecting internal electrodes of the semiconductor device to an external device, each of the external electrode terminal means having a stopper portion which engages with one of the through holes and a spring portion which abuts against an inner wall of the through hole.

According to the present invention, external electrode terminal parts and a plastic terminal supporting body are individually prepared, and the terminal parts are inserted into through holes in the terminal supporting body, thereby completing a terminal holder. A stopper portion is provided at a predetermined position on each of the terminal parts in the longitudinal direction such that the stopper portion is wider than the width of the through hole in the terminal supporting body. Hence, the distance between the terminal supporting body and the end of the external electrode terminal parts is defined when the terminal parts are inserted into through holes in the terminal supporting body. In addition, since the terminal parts include a spring portion which abuts against the inner wall of the through hole in the terminal supporting body when inserted therein, the terminal parts cannot slip out of the terminal supporting body.

The terminal holder of the present invention is formed by inserting the external electrode terminal parts into the through holes in a plastic terminal supporting body. Therefore, unlike in a conventional terminal holder, the terminal parts do not deform, and a terminal holder can be manufactured easily even if the number of the terminal parts is large or the configuration thereof is complicated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1A is a plan view showing an outer appearance of a plastic packaged high-power semiconductor device in general;

FIG. 1B is a partial cross-sectional front view of the semiconductor device shown in FIG. 1A;

FIG 1C is a partial cross-sectional side view of the semiconductor device shown in FIG. 1A;

DETAILED DESCRIPTION OF THE PREFERRED EMBODIMENT

An embodiment of semiconductor device parts according to the present invention will now be described with reference to the accompanying drawings.

Figure 2:
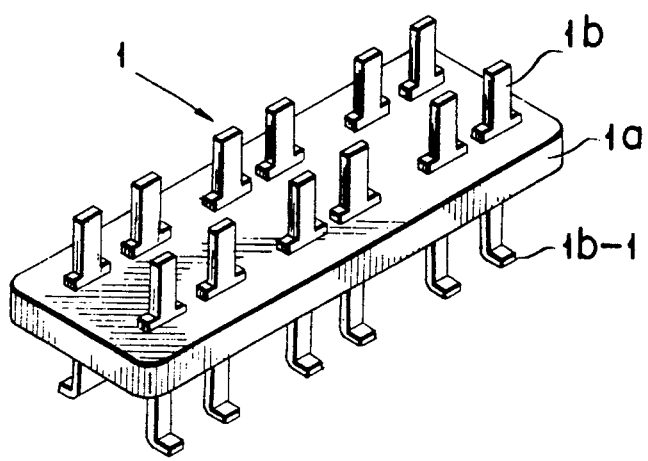
FIG. 2 is a perspective view showing the outer appearance of conventional semiconductor device parts.
Figure 3A:
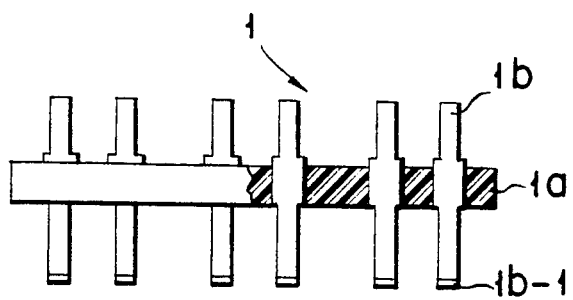
FIG. 3A is a partial cross-sectional front view of the semiconductor device parts shown in FIG. 2.
Figure 3B:
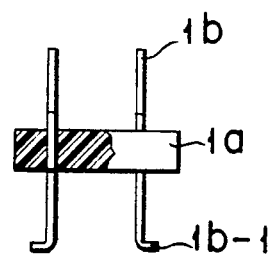
FIG. 3B is a partial cross-sectional side view of the semiconductor device parts shown in FIG. 2.
Figure 4:
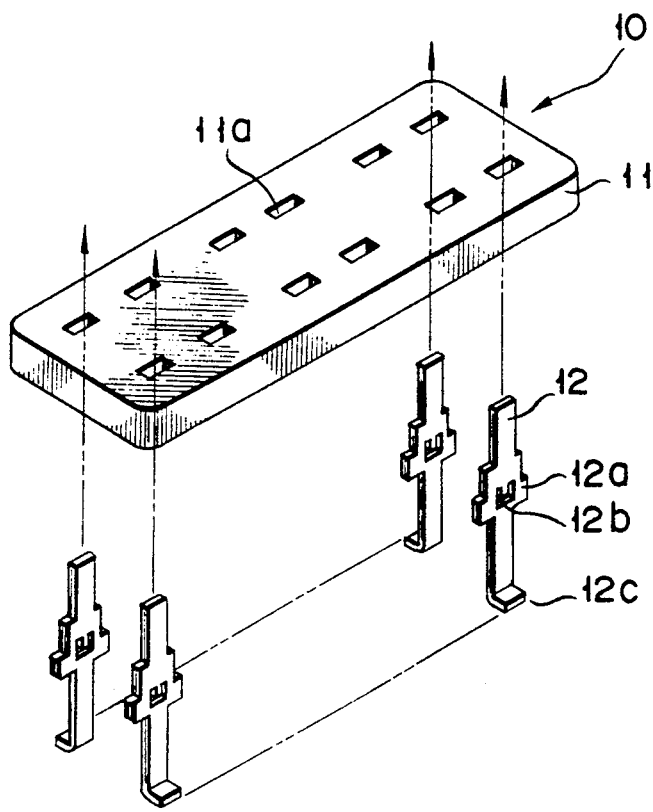
FIG. 4 is a perspective view showing an embodiment of the semiconductor device parts before assembly, according to the present invention.
Figures 5A, 5B:
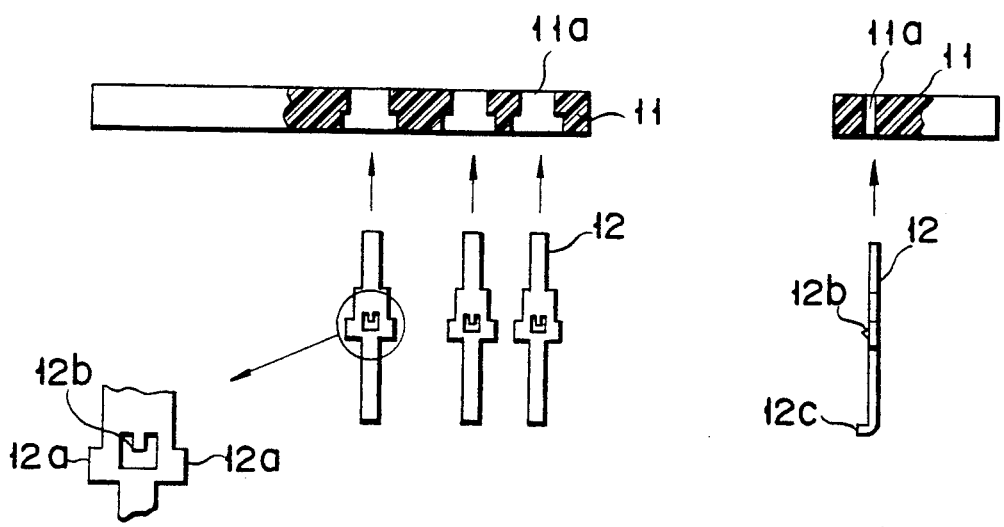
FIG. 5A is a partial cross-sectional front view of the semiconductor device parts shown in FIG. 4.
FIG. 5B is a partial cross-sectional side view of the semiconductor device parts shown in FIG. 4.

FIG. 4 is a perspective view showing an embodiment of semiconductor device parts, i.e., a terminal holder 10, before assembly. FIGS. 5A and 5B are partial cross-sectional front and side views, respectively, of the terminal holder 10. In FIG. 4, a terminal supporting body 11 and external electrode terminal parts 12 are separate from each other. According to this invention, first external electrode terminal parts 12 and a terminal supporting body 11 are individually formed, and thereafter assembled into a terminal holder 10. The plastic terminal supporting body 11 serves as a portion of a package of a plastic packaged semiconductor device, as is generally shown in FIG. 1. A number of rectangularly stepped through holes 11a into which the terminal parts 12 are inserted are formed in the terminal supporting body 11. Each of the holes has a stepped portion. The external electrode terminal parts 12 are inserted into the stepped holes 11a to connect internal electrodes of the semiconductor device to external devices. A stopper portion 12a which is wider than the longitudinal length of the stepped hole 11a and a spring portion 12b, which abuts against the inner wall of the stepped hole 11a, are provided in the middle of external electrode terminal parts 12. Thus, the parts 12 are prevented from slippage out of the stepped holes 11a. The configuration of the stopper portion 12a is determined to fit in with that of the stepped hole 11a. The position of the stopper portion 12a is determined so that inner and outer lead portions of the terminal parts 12 protrude by predetermined lengths from the surface of the supporting body 11 when the terminal parts 12 are inserted into the stepped hole 11a until the stopper portions 12a, i.e., the wider portion of the terminal parts 12 abut against the shoulder portion of the stepped holes 11a of the terminal supporting body 11. Thus, the distance between the terminal support 11 and the end of the terminal parts 12 is defined. The spring portion 12b is punched and bent as a tongue piece in one direction in a press step. An inner lead end 12c of the terminal part 12 is bent to ensure the contact with the electrode bed.

Figures 6A, 6B:
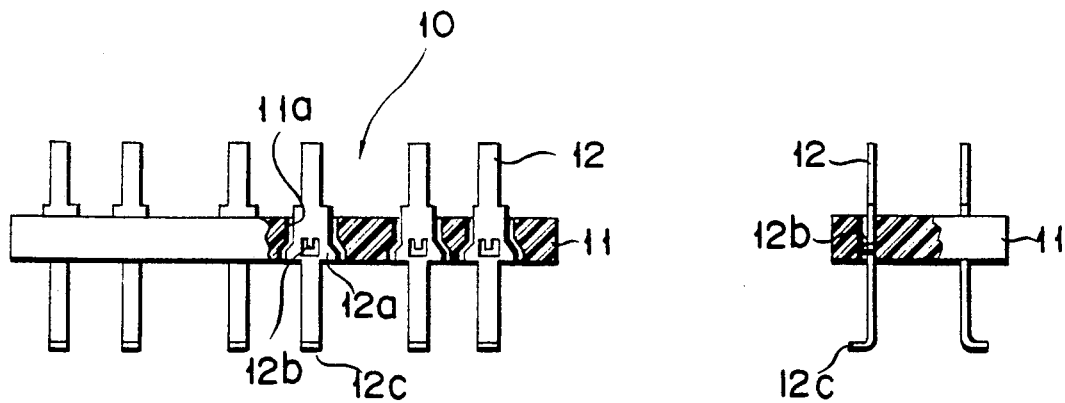
FIG. 6A is a partial cross-sectional front view of the embodiment of the semiconductor device parts after assembly, according to the present invention.
FIG. 6B is a partial cross-sectional side view of the semiconductor device parts shown in FIG. 6A.

FIGS. 6A and 6B are partial cross-sectional front and side views, respectively, showing the embodiment of the semiconductor device after assembly, according to the present invention. The terminal holder 10 is completed by inserting the external electrode terminal parts 12 in the stepped holes 11a of the terminal supporting body 11 outwardly from the package, i.e., in the direction as indicated by the arrows in FIGS. 4 and 5. In the assembled state, there is a clearance between the terminal parts 12 and the inner wall of the stepped holes 11a of the terminal supporting body 11. However, since the spring portions 12b of the terminal parts 12 abut against the inner walls of the stepped holes 11a when the terminal parts 12 are inserted in the stepped holes 11a, the terminal parts 12 are fixed to the terminal supporting body 11 and do not slip out.

The steps of mounting a semiconductor chip on the circuit board 5, connecting the semiconductor chip with the circuit board 5 by bonding wires, and adhering the inner lead end 12c with the inner electrode bed on the circuit substrate 5 by a brazing material (solder etc.) are performed in the same manner as shown in FIG. 1.

Figure 7:
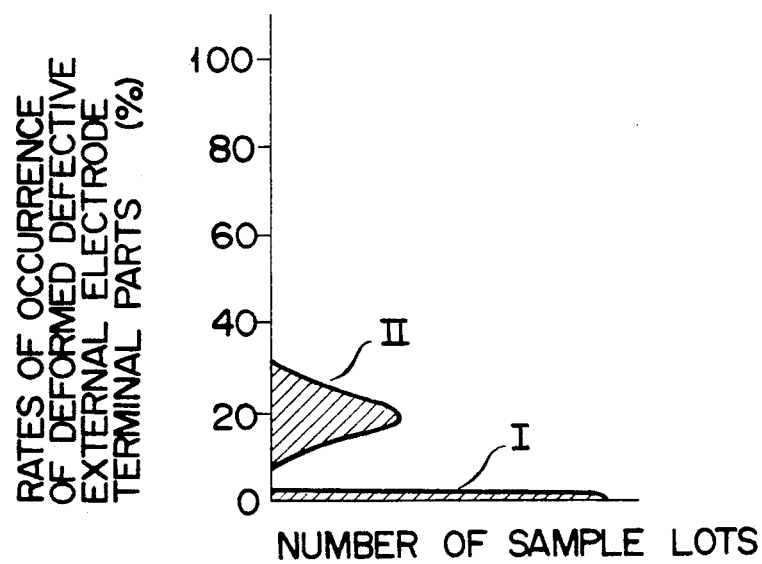
FIG. 7 is a graph showing rates of occurrence of deformed defective external electrode terminal parts.

FIG. 7 is a graph showing rates of occurrence of deformed defective external electrode terminal parts during the molding step. In FIG. 7, the abscissa denotes the number of sample lots, and the ordinate denotes the rate of occurrence (%) of deformed defective external electrode terminal parts in each of the lots. Curve I represents rates of occurrence of defective terminal holders 10 according to the present invention in which external electrode terminal parts 12 and a plastic supporting body are individually formed and thereafter assembled. Curve II represents rates of occurrence of defective terminal holders according to the prior art in which external electrode terminal parts are formed integral with a supporting body by the plastic molding. As is clearly shown in FIG. 7, the rate of occurrence of defective terminal holders according to the present invention is suppressed to substantially in the present invention.

As has been described above, the terminal holder 10 of the present invention is formed by inserting the terminal parts 12 into the supporting body 11, which have been formed independently each other. Hence, a large number of external electrode terminal parts or those of a complicated configuration can be manufactured easily, unlike in the prior art. Moreover, since substantially no defective parts are produced in the step of forming the terminal holder of the present invention, the manufacturing cost can be reduced as compared to the prior art.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A semiconductor device, with a plastic package, comprising:

plastic terminal supporting means, having through holes, for serving as a portion of the plastic package of the semiconductor device; and external electrode terminal means, inserted in said through holes, for connecting internal electrodes of said semiconductor device to an external device, each of said external electrode terminal means having a stopper portion which engages with one of said through holes to position said external electrode terminal means in said plastic terminal supporting means and a spring portion which abuts against an inner wall of one of said through holes to fix said external electrode terminal means in said plastic terminal supporting means.

2. The semiconductor device according to claim 1, wherein said stopper portion is a stepped shoulder portion which fits in said one of said through holes.

3. The semiconductor device according to claim 1, wherein said spring portion of each external electrode terminal means is formed by bending a portion of said external electrode terminal means in one direction.

4. The semiconductor device according to claim 1, wherein each said stopper and said spring is formed at substantially the same predetermined position along each external electrode terminal means in a longitudinal direction.

* * * * *